Figure 1:
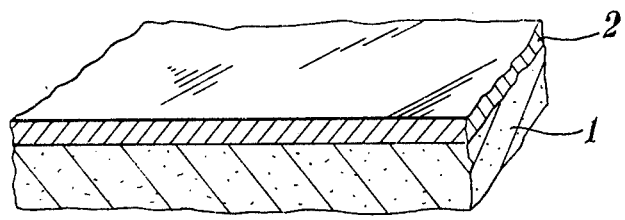

United States Patent [19]

Buiatti

[11] 4,048,712

[45] Sept. 20, 1977

[54] PROCESSES FOR MANUFACTURING SEMICONDUCTOR DEVICES

[75] Inventor: Marina Buiatti, Rome, Italy

[73] Assignee: SELENIA-Industrie Elettroniche Associate S.p.A., Italy

[21] Appl. No.: 636,468

[22] Filed: Dec. 1, 1975

[30] Foreign Application Priority Data

Aug. 8, 1975 Italy .................................. 50889/75

[51] Int. Cl.² .............................................. B01J 17/00
[52] U.S. Cl. ...................................... 29/571; 29/579; 29/580; 357/15; 357/23
[58] Field of Search ......................... 29/571, 578, 579; 357/15, 23

[56] References Cited

U.S. PATENT DOCUMENTS

| 3,711,745 | 1/1973 | Moroney | 357/15 |
| 3,758,943 | 9/1973 | Shibata | 29/579 |
| 3,813,291 | 5/1974 | Joshi | 357/15 |

Primary Examiner—W. Tupman
Attorney, Agent, or Firm—Beveridge, De Grandi, Kline & Lunsford

[57] ABSTRACT

A process for manufacturing MES-FET transistors with self-aligned Schottky barrier gate electrode, in which a layer of metal is deposited on a semiconductor slice, a resist geometry corresponding to the spacing of the drain and source ohmic contacts is defined, the excess metal is etched away with controlled underetching under said resist, a metal is then evaporated for forming the ohmic contacts, the metal remaining after said etching constituting the self-aligned gate electrode.

4 Claims, 6 Drawing Figures

PROCESSES FOR MANUFACTURING SEMICONDUCTOR DEVICES

The present invention relates to an improvement in the processes for manufacturing semiconductor devices.

More particularly, the present invention relates to a process for manufacturing the self-aligning gate electrode for field effect transistors with Schottky barrier gate electrode.

The present invention will be described particularly with reference to the embodiment of the self aligning gate electrode for field effect transistors of the cited type, only by way of example, being however clear for a person skilled in the art that the process according to this invention can find a general use in the manufacture of other semiconductor devices and in the techniques of the integrated circuits.

In the manufacture of field effect transistors with Schottky barrier gate electrode (MES FET) destined particularly to operate up to frequencies of the order of several GHz, it is required that the metal strip forming the gate electrode, typically a strip, one or two microns wide, and some hundreds microns long, be carefully positioned between two ohmic contacts (source and drain) which have two faced edges and spaced apart from one another through a few microns. The distance between the edges of the ohmic contacts and the sides of the metal strip forming the gate electrode is in the order of one or two microns.

According to the known techniques, structures of this kind are realized by forming with known photolithographic techniques the ohmic contacts and subsequently aligning the control electrode in the space between the two ohmic contacts by means of a mask aligner.

While various techniques are known in order to obtain self aligning gate electrodes for field effect transistors, up to now it was not possible to satisfactorily obtain a self aligning gate electrode structure when said gate electrode is of the Schottky barrier type.

The present invention will be now described with reference to one embodiment thereof at present preferred, disclosed by way of illustrative and non limitative example and with reference to the attached drawings, wherein the FIGS. 1 to 6 show the sequential stages for obtaining a self-aligning, Schottky barrier, gate electrode.

In the following description reference will be made, by way of non limiting example, to a gate electrode consisting of aluminum on a semiconductor substrate, such as silicon, or gallium arsenide. The process can be equally utilized with other metals which can be chemically etched, in a controlled way without etching the semiconductor substrate. With reference to the drawings, a substrate of semiconductor material 1, with its upper surface prepared in a known way, is coated for instance by evaporation under vacuum with a metal layer 2 (aluminum) for a thickness of the order of one micron (FIG. 1).

Figure 2:
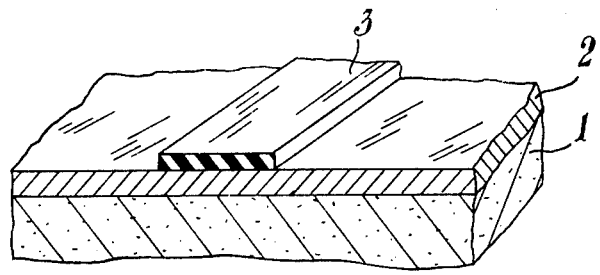

Over the aluminum layer a strip 3 is applied of a material resistant to the chemical agents, for the subsequent etching of the surrounding metal, for instance a strip of photoresist, four or five microns wide corresponding to the space between two ohmic contacts which will be subsequently embodied (FIG. 2).

The subsequent stage is that of chemically etching in a controlled way the metal layer 2 so as to have an underetching 4 which defines the space between the non etched metal 2' and the sides of the ohmic contacts which will be then embodied.

If the metal 2 is aluminum, and the substrate 1 is gallium arsenide, the etching can be suitably effected by a 5% solution of hydrofluoric acid in water.

Figure 3:
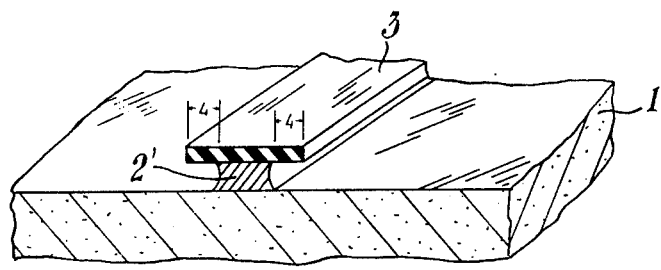

A typical value of the underetching 4 can be of the order of one or two microns (FIG. 3).

Then the ohmic contacts 5, 6 are embodied by deposition under vacuum of suitable materials, for instance in case of gallium arsenide, indium will be deposited. It is also possible to use binary Au-Ge compositions.

Figure 4:
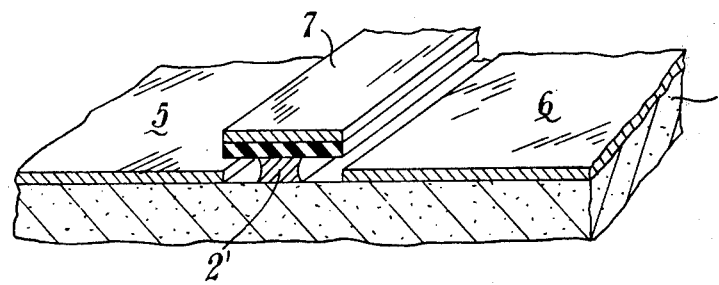
Figure 5:
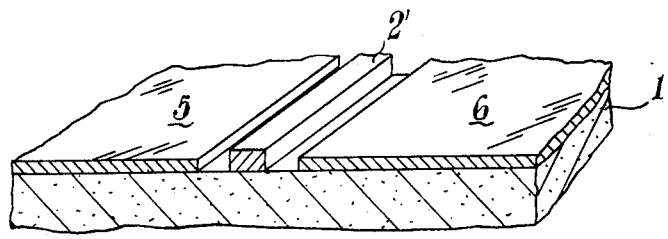

In this deposition stage also the coating of the cover of the layer 7 of resist 3 occurs. Since, as it is known, the deposition of vapour phase occurs by substantially parallel molecular rays, the sides of the ohmic contacts 5, 6 will be defined with precision by the shadow of the resist strip 3 obtaining thus the self aligning of the thin strip 2' of aluminum left by the chemical etching which forms the Schottky barrier gate (FIG. 4).

Figure 6:
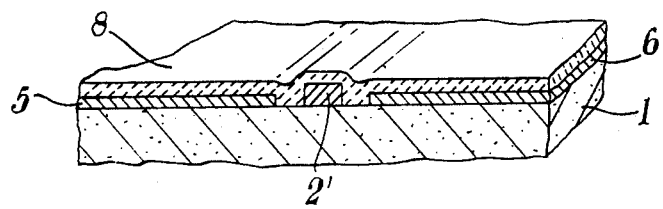

The resist 3, and the overlying metallization 7 are removed by known techniques, for instance dissolving the resist 3 by a solvent. Thus the structure of FIG. 5 will be obtained. Subsequently, in a way known to a person skilled in the art, the ohmic contacts 5, 6 are alloyed. During this stage, the previously obtained geometry can be maintained by a layer of inert material 8, for instance $CaF_2$ (FIG. 6).

The process according to this invention, as hereinbefore described, is particularly suitable for the manufacture of the MES FET type transistors, as usable as oscillators and amplifiers up to frequencies of the order of 10 GHz (Band X).

As the process according to this invention renders unnecessary the aligning operation for the gate electrode, the advantages as follows will be obtained:

a. the expensive equipments for the alignment are no more necessary;

b. the working times are shortened;

c. no specialized work is required for the difficult aligning operation;

d. the geometry (and therefore the electrical properties) can be easily repeated.

Furthermore, as the gate electrode and the Schottky junction are formed in the semiconductor slice before the deposition of any other material thereon, the further advantages as follows are obtained:

a. whatsoever chemical etching can be used for the deep cleaning of the surface with no danger of damaging other materials or of ruining the photolighographic definition;

b. it is possible to hot-deposit the gate material obtaining thus better junctions;

c. the photolithographic definition by contact is made on a flat surface with no discontinuity as created by the ohmic contacts, so that the definition of the geometry will be more precise;

d. the mask used for the photolithographic definition does not contain very refined geometries (about 5 microns instead of the order of one micron). Accordingly, the mask can be manufactured with simpler techniques and equipments, and its cost is highly reduced.

The present invention has been described with reference to one embodiment thereof at present preferred, and it will be understood that changes and modifications might be entered by a person skilled in the art without departing from the scope of the present industrial privilege.

Having thus described the present invention, what is claimed is:

1. A process of manufacturing a field effect transistor having a Schottky barrier gate electrode, comprising the steps of providing a substrate of semiconductor material, depositing on the exposed surface of said substrate a first metal layer, a part of which will form the Schottky junction gate electrode, applying on said metal layer a strip of photo-resist having a width greater than the final width of said gate electrode and corresponding to the desired spacing between two ohmic contacts of said field effect transistor, chemically etching said first metal layer to obtain a desired underetching with respect to said photo-resist strip, applying a second metal layer to said substrate by an evaporation process to form said ohmic contacts, the edges of said contacts being defined with precision by the edges of said resist strip, and removing said photo-resist strip from said gate electrode and alloying said ohmic contacts.

2. A process as claimed in claim 1, wherein said first metal layer forming the gate electrode consists of aluminum.

3. A process as claimed in claim 1, wherein said substrate semiconductor material consists of gallium arsenide.

4. A process as claimed in claim 1, wherein the chemical etching is carried out by a diluted solution of hydrofluoric acid.

* * * * *